US009637377B2

(12) United States Patent
Reinert et al.

(10) Patent No.: US 9,637,377 B2
(45) Date of Patent: May 2, 2017

(54) METHOD FOR FORMING A MICRO-SURFACE STRUCTURE AND FOR PRODUCING A MICRO-ELECTROMECHANICAL COMPONENT

(75) Inventors: Wolfgang Reinert, Neumünster (DE); Jochen Quenzer, Itzehoe (DE); Kai Gruber, Drage (DE); Stephan Warnat, Flintbek (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 671 days.

(21) Appl. No.: 13/129,601

(22) PCT Filed: Nov. 17, 2009

(86) PCT No.: PCT/EP2009/065293
§ 371 (c)(1),
(2), (4) Date: Aug. 12, 2011

(87) PCT Pub. No.: WO2010/057878
PCT Pub. Date: May 27, 2010

(65) Prior Publication Data
US 2011/0287214 A1 Nov. 24, 2011

(30) Foreign Application Priority Data

Nov. 18, 2008 (DE) .................. 10 2008 057 858
Dec. 5, 2008 (DE) .................. 10 2008 060 796

(51) Int. Cl.
*B05D 5/12* (2006.01)
*B81C 1/00* (2006.01)
(Continued)

(52) U.S. Cl.
CPC ........ *B81C 1/00206* (2013.01); *B81B 7/0038* (2013.01); *G01J 5/045* (2013.01);
(Continued)

(58) Field of Classification Search
USPC ................................ 427/58, 98.4, 99.1, 123
See application file for complete search history.

(56) References Cited

U.S. PATENT DOCUMENTS 4,769,345 A * 9/1988 Butt et al. ........................ 29/827
5,701,008 A * 12/1997 Ray et al. ..................... 250/352
(Continued)

FOREIGN PATENT DOCUMENTS

JP       2000057940 A    2/2000
JP       2002352700 A   12/2002
(Continued)

OTHER PUBLICATIONS

Kostovski et al., "Sidewall Corrugation lithography: Bulk Fabrication of ordered nanowire, nanoribbons and nanorings" Applied Physics Letters, vol. 92, Jun. 2008.*
(Continued)

*Primary Examiner* — Brian K Talbot
(74) *Attorney, Agent, or Firm* — Stevens & Showalter, LLP

(57) ABSTRACT

The present invention relates to a method for forming a micro-surface structure on a substrate, in particular for producing a micro-electromechanical component, a micro-surface structure of this type, a method for producing a micro-electromechanical component having a micro-surface structure of this type and such a micro-electromechanical component. The invention is particularly relevant for components of microsystem technology (MST, micro-electromechanical systems MEMS) and the construction and con-
(Continued)

nection technology for hermetically housing micro components, preferably using getter materials.

30 Claims, 7 Drawing Sheets

(51) Int. Cl.
    *B81B 7/00*      (2006.01)
    *G01J 5/04*      (2006.01)
    *H01L 23/26*     (2006.01)
    *B32B 3/30*      (2006.01)

(52) U.S. Cl.
    CPC ............... *H01L 23/26* (2013.01); *B32B 3/30* (2013.01); *H01L 2924/0002* (2013.01); *Y10T 29/4913* (2015.01); *Y10T 428/24174* (2015.01); *Y10T 428/24612* (2015.01)

(56) References Cited

U.S. PATENT DOCUMENTS

| | | | |
|---|---|---|---|
| 6,306,740 B1 | 10/2001 | Hattori | |
| 6,346,455 B1* | 2/2002 | Thakur | H01L 28/87 257/E21.009 |
| 6,923,625 B2* | 8/2005 | Sparks | 417/48 |
| 7,115,436 B2 | 10/2006 | Lutz et al. | |
| 7,147,908 B2* | 12/2006 | McKinnell et al. | 428/141 |
| 7,211,881 B2* | 5/2007 | McKinnell et al. | 257/678 |
| 7,462,931 B2* | 12/2008 | Summers | 257/704 |
| 2002/0149096 A1 | 10/2002 | Liebeskind | |
| 2004/0100594 A1 | 5/2004 | Huibers et al. | |
| 2004/0203313 A1 | 10/2004 | Ramamoorthi et al. | |
| 2004/0253476 A1 | 12/2004 | Conte et al. | |
| 2006/0076634 A1 | 4/2006 | Palmateer et al. | |
| 2007/0262428 A1 | 11/2007 | Summers | |
| 2008/0099862 A1 | 5/2008 | Fujii et al. | |

FOREIGN PATENT DOCUMENTS

| | | | |
|---|---|---|---|
| JP | 2006501679 A | 1/2006 | |
| JP | 2007523467 A | 8/2007 | |
| JP | 2007291529 A | 11/2007 | |
| JP | 2007316005 A | 12/2007 | |
| JP | 2008135690 A | 6/2008 | |
| WO | 2004032230 A2 | 4/2004 | |
| WO | WO 2004/032230 * | 4/2004 | |
| WO | 2005047558 A2 | 5/2005 | |

OTHER PUBLICATIONS

Hawkeye et al. "Glancing angle deposition: fabrication, properties, and applications of micro and nanostructures films", Journal of VAcuum Science and Technology A 25(5) Jul. 30, 2007.*

Kostovski Gorgi et al.; Sidewall corrugation lithography: Bulk fabrication of ordered nanowires, nanoribbons, and nanorings; Applied Physics Letters; Jun. 4, 2008; pp. 23109-1 to 223109-3; vol. 92, No. 22; American Institute of Physics, USA.

Islam M Saif, et al; Ultrahigh-density silicon nanobridges formed between two vertical silicon surfaces; Nanotechnology; Jan. 23, 2004; pp. L5-L8; vol. 15, No. 5; IOP Publishing Ltd, UK.

Songping Chen et al.; NanoGetters for MEMS Hermetic Packaging; 7th IEEE Conference on Nanotechnology, 2007, IEEE—Nano 2007, Hong Kong China; Aug. 2-5, 2007; Aug. 2, 2007; pp. 921-924; IEEE Service Center, Piscataway NJ USA.

Götz, Andreas; International Search Report; PCT Application No. PCT/2009/065293; Dec. 6, 2010; European Patent Office; Rijswijk Netherlands.

Gorgi Kostovski et al.; Sidewall corrugation lithography: Bulk fabrication of ordered nanowires, nanoribbons, and nanorings; AIP Applied Physics Letters; 2008; 92; 223109; American Institute of Physics.

R. Kullberg et al.; Getters for Microlectronic Packages Solving Hydrogen Degradation Problems; Advanced Packaging; www.apmag.com; Dec. 2004; pp. 30-33.

W. Reinert; High Vacuum Wafer Bonding Technology; Contribution to MST News: Special Edition on MST Packaging; Feb. 2005; pp. 1-3.

A J Hart et al.; Uniform and selective CVD growth of carbon nanotubes and nanofibres on arbitrarily microstructured silicon surfaces; Nanotechnology 17; Feb. 2006; pp. 1397-1403; Institute of Physics Publishing; UK.

D. Sparks; An all-glass chip-scale MEMS package with variable cavity pressure; Journal of Micromechanics and Microengineering 16; Oct. 6, 2006; pp. 2488-2491; Institute of Physics Publishing; UK.

M. M. Hawkeye; Glancing angle deposition: Fabrication, properties, and applications of micro- and nanostructured thin films; J. Vac. Sci. Technol. A 25(5); Jul. 30, 2007; American Institute of Physics.

Agnes Wittmann-Regis; International Preliminary Report on Patentability; PCT application No. PCT/EP2009/065293; Jun. 3, 2011; The International Bureau of WIPO; Geneva, Switzerland.

* cited by examiner

METHOD FOR FORMING A MICRO-SURFACE STRUCTURE AND FOR PRODUCING A MICRO-ELECTROMECHANICAL COMPONENT

FIELD OF THE INVENTION

The present invention relates to a method for forming a micro-surface structure on a substrate, in particular for producing a micro-electromechanical component, a micro-surface structure of this type, a method for producing a micro-electromechanical component having a micro-surface structure of this type and such a micro-electromechanical component. The invention is particularly relevant for components of microsystem technology (MST, micro-electromechanical systems MEMS) and the construction and connection technology for hermetically housing micro components, preferably using getter materials.

BACKGROUND OF THE INVENTION

For reliable operation in a desired period of use of a micro component, for example a micro-electromechanical component such as a micro sensor or micro actuator, the atmosphere in the component is intended to be adjusted and maintained in accordance with the function. In numerous micro components, penetrating gases are harmful when the function of the component is based on controlled vacuum conditions or the maintenance of a specific pressure. It may also be necessary to form in the component an atmosphere with a specific composition over the entire period of use. In particular, oxygen, hydrogen and water vapour are undesirable in hermetic housings. In addition to the resultant pressure increase, however, gases can also activate other damaging mechanisms.

It is generally known to adjust and maintain the atmosphere in a micro component by introducing functional materials, in particular getter materials. The quantity of getter material to be used in order to produce, adjust and maintain the atmosphere is dependent on the absorption capacity thereof. This in turn is highly dependent on the exposed surface as an effective surface and reaction surface with gas molecules. In principle, it is known to obtain the effective surface by means of surface structuring of the substrate, porous or finely structured functional material films or getter films or by means of columnar grain structures of a thin getter film. With an integrated getter, the internal pressure increase is slowed down, since all active air gases are absorbed, and only the penetrated inert gas portion of the air leads to a pressure increase. An ideal getter without any saturation effect by taking up active air gases limits the internal pressure increase in the long term to approximately 9.3 mbar (sum of all inert gas partial pressures in the atmosphere). Consequently, the internal pressure is 100 times lower than in housings without any getter.

Another possibility here in addition to the use of a getter for achieving a sufficiently long period of use for the micro component is, for example, to double the housing inner volume. Owing to a more deeply etched cavity, the pressure increase or the change of atmosphere in the housing is slowed down, for example, by a half. However, for reasons of mechanical component stability and component size, this geometric approach often can no longer be used or can be used only in a limited manner.

The necessary capacity of the functional material in a hermetic housing can be defined by the fact that the functional material retains its respective function to a sufficient degree over the entire service-life of the component. In the case of a getter, its getter capacity can be defined by the fact that, in the event of an assessed critical air leakage rate, no getter saturation occurs within the guaranteed service-life of the component. Generally, the air leakage rates which can currently be verified are at best in the range of $10^{-14}$ mbar·l/s. Known thin layer getters must be integrated in the housing over a very large surface-area in order to provide the necessary getter capacity. The trend towards increasingly small component geometries is counterproductive with respect to a sufficiently long function of the functional or getter material since there is, for example, no sufficiently planar surface for arrangement of the material, whereby a critical situation may occur with components which require a longer service-life.

The introduction of functional materials or getters in microtechnical components can be carried out in different manners. At the beginning of miniaturised vacuum housing at wafer level, porous shaped components of the corresponding material were introduced into housing cavities provided specially for that purpose. The lateral arrangement often used in this instance disadvantageously increases the size of the component so that the quantity of the functional or getter material available in the housing is also limited. As an alternative housing construction, metal carrier films with sintered getter layers were welded, in the housing cover, for example, or impressed immediately as a thick layer into the housing cover and sintered therewith. The vertical arrangement saves space, but any particles which occur disadvantageously fall directly onto the sensitive component structure. The getter activation in both cases is generally carried out after hermetic housing closure by means of tempering in an oven (R. Kullberg et al., Getter for microelectronic packages, Advanced Packaging, 12/2004, pages 30-33). After component capping has been introduced at wafer level, getters were placed as an NEG shaped component in cavities which are reserved for them at the side of the resonator and which are connected thereto by means of channels. The development of structurally precipitatable thin film getters directly in recesses of the cap wafer allowed vacuum housings at wafer level with cavity volumes in the region of a few nanoliters (High vacuum wafer bonding technology, AuSi eutectic wafer bonding with integrated getter thin film for long term stable high vacuum, W. Reinert, MST News, special edition concerning wafer bond technology, February 2005).

The integration of a getter material or other functional material into a vacuum wafer bonding process for producing micro components places high demands on the material itself. It must behave passively during storage and wafer handling, there must be no wafer distortion owing to layer stress, the precipitation temperature must not be too high (<300° C.), the structuring thereof must not limit the cap wafer process (the production of the passive cap) with respect to the selection of metal and depth of the cavities, it must adhesively bond in an excellent manner and emit no particles, the characteristic features thereof must not change in a negative manner owing to wafer cleaning, no inert gas must be discharged during the wafer bonding operation, the activation temperature thereof should not be above joining temperature and the activation process should not last too long. In addition a getter should not already become saturated owing to the gas emissions during the wafer bonding operation, and any bonded gas must not be released again at normal operating temperatures of the component.

Another problem which occurs when getters are used is described below. Oxygen and nitrogen as gases to be absorbed are chemically bonded by the getter and converted to corresponding oxides or nitrides on the surface thereof. Since the oxides and nitrides formed take up a larger volume than the converted getter material, the chemical reaction of the getter is also associated with the development of mechanical stress which under some circumstances can exceed a critical level and can bring about flaking or similar material defects in the getter structure. Although the formation of the oxides and nitrides can also lead to the reactivity of the getter being limited, these layers hinder the further reaction of the getter with the gases. If a critical layer thickness is exceeded, the further reaction of the getter is stopped, whereby the getter has initially reached its maximum capacity.

SUMMARY OF THE INVENTION

Based on the prior art described above, an object of the present invention is, in the case of micro components or functional groups for the production thereof, to better use the specific capacity of functional materials used, such as, for example, getters, the intention being for the mechanical integrity and stability of the functional material to remain ensured in particular after a relatively long period of use and in the case of getters after reaction and saturation with absorbed gases. Also, the volumes required for the functional material are not to be increased, the functional material is to be arranged in a mechanically stable manner and the function of the micro component is not to be impaired or is to be only insubstantially impaired. Furthermore, the production of the mentioned micro components or functional groups is to be as simple as possible and not made more complex. Finally, the disadvantages of the prior art set out above are to be overcome.

With regard to the method, the object is achieved with a method for forming a micro-surface structure on a substrate, in particular for producing a micro-electromechanical component, in which there is formed on or in the substrate a first fine structure which has at least one projection and/or recess, in particular a large number of projections and/or recesses, the projection(s) and/or recess(es) having a surface which is to be coated with the functional material and which extends substantially perpendicularly or in an inclined manner relative to the substrate plane, the surface of the first fine structure to be coated with the functional material having, at least in regions, wave-like or bump-like projections and/or recesses which act as nucleation points at which the functional material is preferably precipitated and deposited, and the functional material being applied in the form of a second fine structure with solid members which protrude from the surface to be coated, preferably in the form of blades and/or rods.

For the sake of better understanding, the projection(s) and/or recess(es) of the first fine structure are referred to below as a first projection and/or recess or first projections and/or recesses. This/these first projection(s) and/or recess(es) of the first fine structure has/have a surface which is to be coated with the functional material and which extends substantially perpendicularly or in an inclined manner relative to the substrate plane. This surface of the first fine structure to be coated with the functional material again has, at least in regions, wave-like or bump-like projections and/or recesses which will be referred to below as second wave-like or bump-like projections and/or recesses in order to be able to differentiate them from the first projections and/or recesses of the first fine structure. The second projections and/or recesses of the surface to be coated act as nucleation points at which the functional material is preferably precipitated.

This object is further achieved with regard to the method by a method for arranging a getter as a functional material on a substrate, in particular according to any one of claims 1 to 7, the getter material being applied to a surface on the substrate which has wave-like or bump-like projections and/or recesses, at least in regions. The wave-like or bump-like projections and/or recesses act in particular as nucleation points at which the functional material is preferably precipitated.

With regard to the device, the problem addressed by the invention is solved with a micro-surface structure which is in particular produced with a method of claims 1 to 9, there being provided in or on a substrate a first fine structure which has at least one projection and/or recess, in particular a large number of projections and/or recesses, having a surface which is substantially perpendicular or inclined relative to the substrate plane, a functional material being arranged on the surface of the projection(s) and/or recess(es), the functional material being constructed in the form of a second fine structure with solid members that protrude from the surface of the projection(s) and/or recess(es), in particular in the form of blades or rods. The surface of the first projections and/or recesses that is substantially perpendicular or inclined relative to the substrate plane has, in particular at least in regions, second wave-like or bump-like projections and/or recesses which have acted as nucleation points for the functional material arranged in the form of the second fine structure. The solution further involves a micro-electromechanical component having a micro-surface structure according to any one of claims 10 to 13, having the substrate as a base, intermediate or cover element.

A functional material in the context of the present invention generally refers to materials which have a specific function in a micro component or the production thereof. It is possible to cite by way of example in this context getter materials in the broadest sense which have an attracting or bonding effect on other substances. Other functional materials may be optical absorber layers or anti-reflective coatings for optically transparent housing elements or adhesive films as particle catchers. The functional materials may also be materials which are highly saturated with gas, for example with argon or hydrogen, and which can be used, for example, in the context of components with multiple activities, if the cavities are to have different inner pressures. As getters, it is possible to consider those materials which attract, bond or take up one or more substances chemically, physically or in another manner. Nitrogen, for example, is physisorbed at an active location of an activated getter. Chemical bonding takes place which permanently bonds the gas. A moisture getter may comprise a dielectric material with a specific porosity and preferably be coated with a metal. Water molecules are accumulated in the porous structure of the moisture getter owing to their polarity. A getter in the context of the invention comprises the metals Ti, Cr, Zr, Al, V, Co, Hf, Ba, Fe, La in particular as a pure metal or any alloy of these metals, for example TiAl, ZrAl, TiSi, TiZr or ZrCo. The use of porous $SiO_2$ is particularly advantageous. It is also possible to adjust two or more pure metals or alloys or a defined sequence of different metal layers. The functional or getter material may in particular be provided with catalytically effective components, such as, for example, platinum and/or nickel. A coating with a functional or getter material in the context of the invention is to be understood to be a single or multi-layer arrangement of the respective material above or beside each other over the entire surface or only in regions.

A micro-surface in the context of the invention is a surface which is produced using a method for producing micro-electromechanical components. It has surface structures which generally have a size in a range between 10 nm and 50 µm and a height between 5 nm and 600 nm, preferably 30 nm (Scallops). Other preferred sizes are disclosed below.

The technological approach of the present invention is based on a first fine structuring of a substrate, to which a functional material in the form of a second fine structure is applied. The first fine structure is formed on or in the substrate. This is preferably carried out by means of an etching method, in particular a dry etching method using reactive gases such as, for example, CF4 and SF6 alternately. Anisotropic dry etching or high-speed etching is particularly suitable. The first fine structure can also be formed by means of laser engraving. When the first fine structure is formed, there are produced in or on the substrate structures, which are also referred to in the present description as first projections and/or recesses, having walls, surfaces or surface regions which are substantially vertical or inclined relative to the substrate plane. These constitute the surface which is to be coated with the functional material. The geometries of these structures may be freely selected, for example linear recesses, winding recesses, spirals, formed cylinders or parallelepipeds or honeycomb structures with any number of corners or round holes, preferably in a matrix-like arrangement. The structure widths are generally greater than 1 µm. The structures can have any depth or height per se, preferably up to 50 µm, more preferably from 10-20 µm, even more preferably from 5 nm to 600 nm and in a particularly advantageous manner a depth of 30 nm. The spacing of adjacent structures is from 3-40 µm, in a particularly preferred manner 4 µm. The surfaces to be coated with the functional material are preferably at an angle of between 45° and 135°, more preferably between 87° and 95° relative to the substrate plane; surfaces which are substantially perpendicular relative to the substrate plane are particularly suitable.

According to the invention, the functional material is applied to the corresponding walls, surfaces or surface regions in the form of a second fine structure with solid members which protrude from the surface of the first fine structure to be coated, preferably in the form of blades and/or rods. The solid members are advantageously spaced apart from each other and they are individual members which in principle have any configuration with intermediate spaces between adjacent solid members. The first and second fine structure provided according to the invention leads to a dual structural or surface enlargement of the functional material. The first fine structure leads to an increase of the surface of the substrate on which it is then possible to arrange more functional material and alternatively or additionally the functional material can be arranged with a larger surface than is the case with a planar substrate surface. Added to this effect is the surface-enlarging second fine structure of the functional material itself. Owing to the spaced-apart solid members the effective surface available for the desired function is again enlarged. On the whole, the specific functional capacity of the functional material can thereby be better used. In addition to increasing the effective surface, the spacing provided between the solid members has the additional purpose, in the case of a function-related volume increase of the functional material, for example a getter, of acting as an expansion space for the (getter) material which increases in volume as a result of gas absorption owing to the chemical reaction. Owing to the free expansion possibility of the solid members, flaking of partially saturated getter surfaces is prevented, which in turn leads to better reliability and a longer service-life for the micro components produced in this manner.

In a particularly advantageous manner, the second fine structure has solid members in the form of blades and/or rods. These shapes, as will be explained in greater detail below, can be produced in a simple manner with the method according to the invention. The blades further have, with the dimensions of micro components, a good level of strength, strength of connection to the substrate and stability, whilst with rods as opposed to blades the effective surface-area is greater with reduced stability. However, the solid members can also be constructed in other geometric forms or modifications. The blades may, for example, be straight or bent. In the case of columnar getter films which have grown on planar surfaces, as a side effect of the mechanical grain decoupling a slight mechanical stress is produced in the getter layer which stabilises at a low level.

The application of the functional material can be carried out in principle in any manner, for example by means of vapour deposition or sputtering. However, precipitation of the functional material by means of vapour deposition, for example in a unit with a planet gear mechanism, is particularly preferred. It is possible to use any evaporation methods, such as thermal evaporation, electron beam, laser beam or light beam evaporation. In these generally known methods, the functional material to be vapour deposited is evaporated as a target. The evaporated material (atoms, "atom clusters" or molecules) reaches the cooler substrate through a vacuum or reduced pressure chamber. The functional material vapour condenses on the substrate and forms a coating at that location. Advantageously, by means of vapour deposition, an accumulation of gases in the functional material layer is prevented. Subsequent gas evacuation effects of gases accumulated in the functional material can thus substantially be prevented, whereby coatings produced in this manner are particularly suitable for producing or maintaining a high vacuum in component cavities.

The functional material coating can be vapour deposited as a pure material, in particular as a pure metal or alloy from a crucible. It is also possible simultaneously to evaporate two or more pure materials or metals or alloys from different crucibles (co-deposition) or to adjust a defined sequence of different layers by opening and closing screening sheets.

Sputtering is also suitable as a method for applying the functional material. The functional material is atomised by means of ion bombardment and changes into the gas phase. Atoms released from the functional material reach the substrate, condense at that location and form a layer. The method is carried out under a process gas atmosphere. Depending on the relationship of the atomic weight of the process gases to the sputtered material, the sputter gas accumulates in the layer precipitated on the substrate. At high temperatures, the accumulated gas can be discharged again. This is particularly disadvantageous for the relatively light process gas argon and the joining temperatures necessary in the case of eutectic AuSi wafer bonding during the housing closure in the region of 400° C. According to a specific embodiment of the invention, therefore, a heavy inert gas is advantageously used as a process gas during sputtering, for example krypton or xenon. These are accumulated less markedly as process gases in the functional material and discharged therefrom again only at very high temperatures above 500° C.

According to another proposal of the invention, the surface of the first fine structure to be coated with the functional material has wave-like or bump-like or similar projections and/or recesses, at least in regions. These are referred to in particular as second wave-like or bump-like or similar projections and/or recesses and act as nucleation points at which the functional material preferably precipitates and is deposited. Advantageously, the second projections and/or recesses are produced by the first fine structure being formed by the anisotropic dry etching described above. A reproducible surface topography (wave relief) is produced on the mentioned vertical or inclined walls, surfaces or surface regions of the etched structures of the first fine structure. The wave peaks and troughs preferably extend substantially parallel to the substrate plane. The wave relief can be varied by changing the etching parameters with respect to wave spacing and wave depth (wave trough). This variation can also preferably be carried out in a programmed manner during a structuring process. The spacing between adjacent wave loops is preferably from 60-400 nm, depending on the gas exchange frequency. The formation of the wave amplitude is linked to the concentration of the gas. With $SF_6$ as a reactive gas, at low concentrations the wave amplitude is less than 10 nanometers. However, the extent of the wave amplitude is generally limited to less than 50 nm since anisotropy is otherwise lost.

It is particularly advantageous for the functional material to strike the surface topographies described above at an angle of incidence $\alpha$ between 60 degrees and 80 degrees with respect to the substrate plane. The above-mentioned second projections/recesses then bring about a shadowing effect, whereby growth zones of the functional material are formed substantially only on the raised substrate regions. The range of the angle of incidence mentioned can be brought about in a particularly advantageous manner, for example, when using a system with a planet gear, the substrate being exposed with a varying angle of approximately +/−30° relative to the evaporation source. In the case of a first fine structure which is formed by means of anisotropic dry etching with wave peaks which extend parallel to the substrate plane, the functional material in the growth zones preferably forms solid members which are arranged in an inclined manner at an angle $\beta$ relative to the substrate plane, in particular continuous blade structures with a thickness in a range from 20 to 180 nm and a length in a range from 20 nm to a few 1000 nm. The angle $\beta$ is dependent inter alia on the angle at which the substrate is orientated with respect to the evaporation source or with respect to the incidence direction of the functional material and is preferably in a range between 20° and 50°.

According to another configuration of the invention, the (first) projection(s) and/or recess(es) of the first fine structure is/are preferably formed in or on the base of a cavity or recess of the substrate. It is thereby possible to use micro-surfaces according to the invention almost without limitation for housed micro components. Advantageously, the inner space enclosed in the housing can thereby be increased, whereby any potential pressure increase can be slowed down compared with a housing without any cavity. Instead of forming the first projection(s) and/or recess(es) of the first fine structure in a cavity or recess of the substrate, they can be formed on a planar substrate or wafer. The cavity can then be formed when housing the micro component by interposing, for example, a frame-like substrate or wafer between the base substrate and the cover substrate.

After the formation of the first fine structure, the surfaces thereof to be coated can be coated directly after structuring with the functional material or a getter coating, in particular a getter metal coating. Alternatively, according to another configuration of the invention, before the functional material or the getter coating is applied, the surfaces can be provided with a dielectric layer (for example, $SiO_2$, SiN, AlN, $Al_2O_3$) or an electrode metal coating (for example CrAu, TiAu, TiTiNAu, TiCu, TiPtAu, etc.) for a subsequent galvanic metal application, for example, in order to produce a continuous sealing frame.

After the application of the functional material, according to a next embodiment, a gold covering layer can finally be vapour deposited. This is advantageously possible without interrupting the vacuum necessary for the application of the functional material. The gold layer can act as a potential layer for a subsequent galvanic application of sealing frames (for example gold, gold/tin) and protect the functional material layer from an undesirable reaction with air or other media. The gold covering layer can subsequently be selectively etched away or thermally alloyed with the functional material or getter layer whilst it is thermally activated. The covering layer can of course consist of another material which is suitable for the purpose intended in each case and can in particular be produced as a platinum covering layer. With a platinum covering layer, it is advantageously possible to catalyse a decomposition of relatively large molecules at low temperatures, in particular in the operating temperature range of from 80 to 150° C., and to improve the getter efficiency, for example for water, methane, etc.

Additionally or alternatively to a covering layer, it is possible to use platinum and/or nickel as an intermediate layer in a layer stack and/or as a minority alloy element when applying, in particular vapour depositing, alloys which have in particular been produced beforehand. Platinum and/or nickel can be present in particular in the functional or getter material and have a catalytic effect therein.

A specific configuration of the method is characterised in that, on the side of the substrate opposite the first fine structure, another such or similar fine structure is formed. From these two first fine structures, it is possible to coat only one or both with the functional material according to the invention. The two fine structures can be constructed in an identical or different manner. Furthermore, a part of the functional material applied to one or both fine structures can preferably be removed by means of etching. If there are thus formed on both sides of the substrate mutually opposing regions with only the first fine structure in a suitable configuration, these regions can serve to form an anti-reflective structure for infrared radiation. On one side or both sides, instead of the fine structure, it is possible to provide a thin anti-reflective coating. The anti-reflective structure in the IR aperture can be constructed in both an ordered and defined but also purely arbitrary manner (so-called black silicon). In a particularly advantageous manner, it is thereby possible to produce micro-electromechanical components which have a combination of the micro-surface according to the invention with a getter or functional material having an IR aperture. The IR aperture may in particular have an anti-reflective coating comprising at least one thin layer, preferably four alternating layers Ge—ZnS, it is possible to arrange the anti-reflective coating on the side of the substrate facing the component interior and/or on the side of the substrate facing the component exterior. Furthermore, at least one of the anti-reflective coatings provided may have a first fine structure which has at least one projection and/or recess, in particular a large number of projections and/or recesses, having a surface which is substantially perpendicular or inclined with respect to the substrate plane. Adjacent projections or recesses preferably have a spacing from each other of between 3 µm and 40 µm, more preferably of 4 µm and/or the projection(s) or recess(es) a height or depth of preferably less than 50 µm, more preferably between 10 µm and 20 µm. A metal layer may optionally be provided as a screen between the substrate and the anti-reflective coating.

According to another configuration, the functional material applied is structured. The functional material and in particular gas absorbing getter must be individually introduced into each component. This results in a requirement for the getter structuring, for example by means of lithographic lift-off structuring, in which a layer of lacquer is first applied, exposed and developed. The functional material or getter layer is applied afterwards, for example, by means of sputtering or CVD (Chemical Vapour Deposition) and structured by dissolving the layer of lacquer. This structuring method is intended to prevent the functional material or getter surface from becoming contaminated with residual lithography lacquer. However, the structuring of the layer can also already be carried out during the precipitation by using a shadow mask which is, for example, metallic over the substrate. However, it is particularly preferable for a layer of lacquer, in particular a layer of photo lacquer, to be applied to the functional material and for exposed regions of the functional material to be subsequently structured, in particular in a wet chemical and dry manner with reactive gases.

On the whole, the following arrangements of the micro-surface structure according to the invention are conceivable in connection with micro sensors:

1. Arrangement in a covering element, preferably without other functional elements, above or at the side of a micro component located therebelow. The cavity in the covering wafer can be formed by means of dry etching, wet chemical etching, a thick sealing frame or by using a third aperture wafer as a spacer element.

2. Arrangement in a covering element next to or around a defined field (IR aperture) with anti-reflective coating (black silicon with arbitrary arrangement, defined moth eye structures, thin layer) for infrared radiation. The IR aperture can be recessed relative to the substrate surface. For technical reasons relating to the process, an uneven combination of anti-reflective coatings on the outer and inner side may be advantageous. For example, on the outer side there may be provided a thin anti-reflective coating and on the inner side moth eyes or black silicon, or vice-versa, this combination being less advantageous. In addition, on one side or on both sides, it is possible to form an anti-reflective multi-layer coating of Ge—ZnS.

3. Arrangement on the same substrate as the micro component (arranged beside it or around it), the carrier structure preferably being structured from the layer of the same material, for example polycrystalline silicon, silicon germanium or amorphous silicon, as the elements of the micro component itself. It is not significant whether an integrated electronic evaluation or control circuit for the micro component(s) is located on this so substrate.

BRIEF DESCRIPTION OF THE DRAWINGS

Further features and advantages of the present invention will be appreciated from the following exemplary description of a particularly preferred embodiment of the invention, with reference to the Figures, in which.

DETAILED DESCRIPTION OF THE INVENTION

Figure 1:
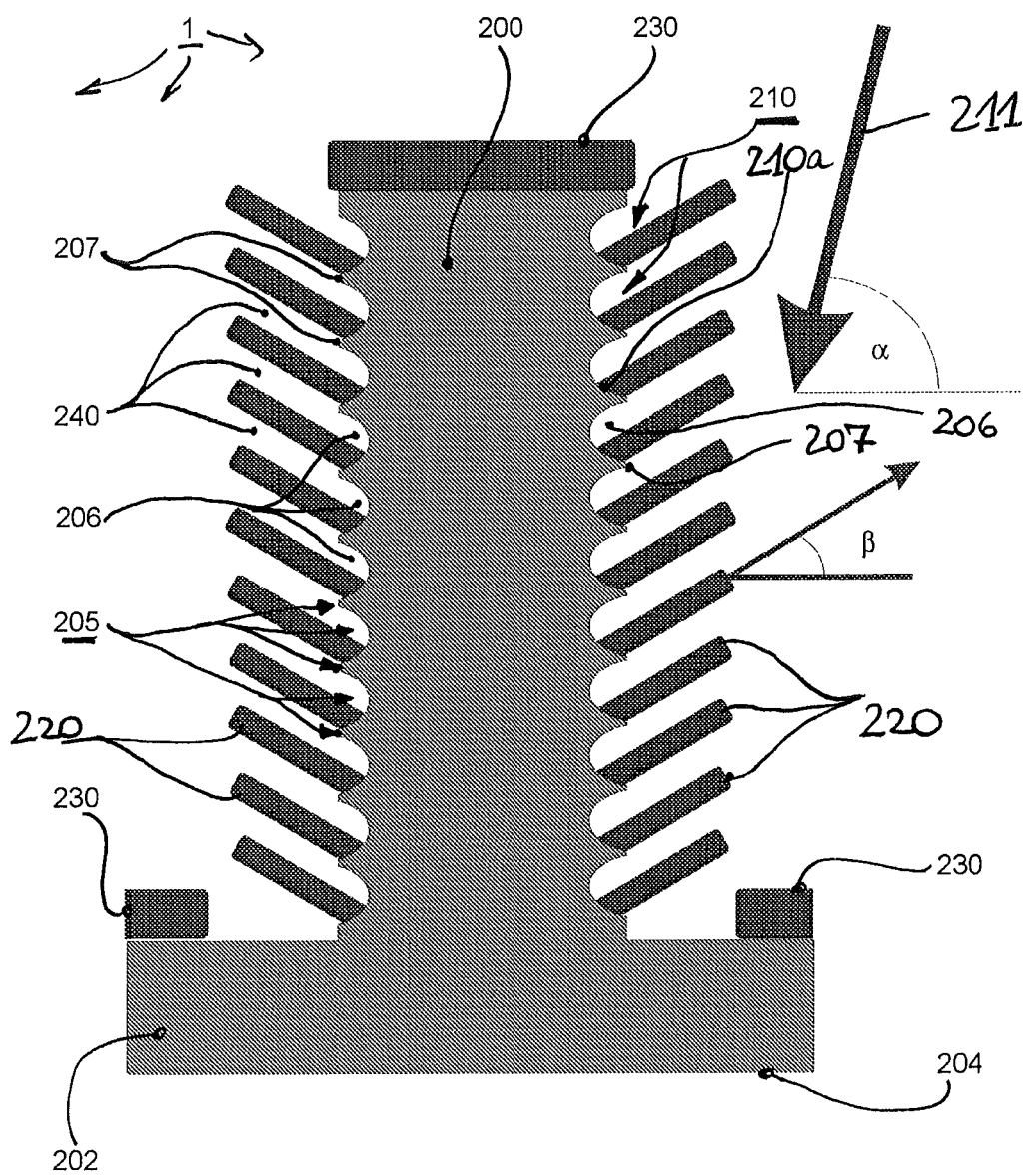
FIG. 1 is a schematic section of a portion of a micro-surface structure transverse relative to the substrate plane.

In FIG. 1, a portion of a micro-surface structure 1 according to the invention is greatly enlarged and illustrated schematically. The micro-surface structure 1 is formed on a substrate 202. The greatly enlarged FIG. 1 illustrates only one solid member 200 of the micro-surface structure 1. This member protrudes perpendicularly relative to the substrate plane 204. This plane extends in the direction of the arrow illustrated in FIG. 1 and perpendicularly relative to the plane of projection. As cannot clearly be seen from FIG. 1, the solid member 200 has a substantially circular cross-section in a cross-section parallel to the substrate plane 204. The surface 205 of the solid member 200 that extends perpendicularly relative to the substrate plane 204 is provided with a wave structure 210 which consists of wave troughs at 206 and wave peaks 207.

The functional material applied to the substrate surface is in the example illustrated a getter material 220, 230 comprising, for example, titanium. The getter material 220, 230 is applied to the substrate surface, for example by means of vapour deposition. The angle of incidence $\alpha$ of the getter or metal atoms, that is to say, the getter material, is identified in FIG. 1. During the vapour deposition of the getter material 220, 230 the micro component 209 to be coated therewith is rotated about a rotation axis perpendicular with respect to the substrate plane 204. Owing to the angle of incidence $\alpha$ formed in an inclined manner relative to the orthogonal line of the substrate plane 204 and the rotation of the entire micro component 209, getter material is precipitated on surfaces orientated parallel with the substrate plane 204, in the example illustrated getter or thin titanium layers 230 on the solid member 200 and getter or thin titanium layers 230 on the surface of the substrate 202 itself. On the surface 205 of the solid member 200 that is orientated perpendicularly relative to the substrate plane 204, the getter or titanium material is deposited owing to the above-described rotation between the angle of incidence $\alpha$ and the surface 205 and the rotation of the micro component 209 in the form of blades 220. The reason for this is the wave structure 210 of the surface 205 of the solid member 200. In the direction of incidence (angle of incidence $\alpha$) of the getter or titanium material 220, 230, the wave peaks 207 shield the wave trough 206 which follows in each case in the direction of incidence from the incident getter or titanium atoms. These can accumulate only in the region of the wave peaks 207 and here in particular on the side of the wave peaks 207 located in the incidence direction 211. The grown accumulations of getter or titanium bring about a continued shielding of the regions or wave troughs 206 following in the direction of incidence α. Owing to the rotation of the micro component 209, the incident material is deposited in the peripheral direction about the solid member 200 in a uniform manner, whereby the said getter or titanium blades 220 are produced. Owing to the inclined angle of incidence α, they are inclined through the angle β with respect to the substrate plane 204. Owing to the spacing between two wave peaks 207, the blades 220 are also constructed so as to be spaced apart from each other and the intermediate spaces 240 are formed between adjacent blades 220.

The solid members 200 form the first fine structure 2 in accordance with the invention, and the blades 220 form the second fine structure 3 in accordance with the invention.

Figure 2:
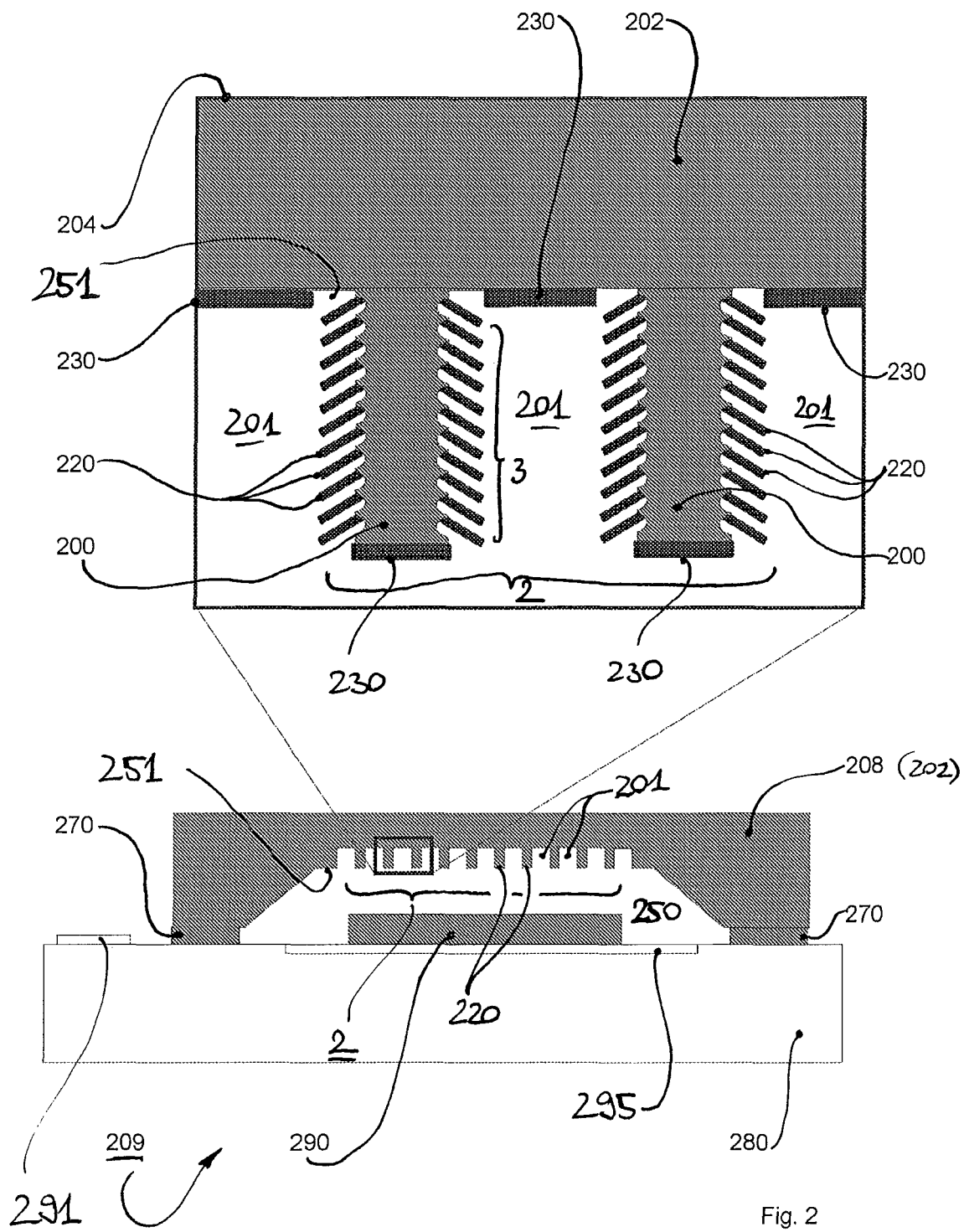
FIG. 2 is a schematic section of a micro-electromechanical component having micro-surface structures according to FIG. 1.
Figure 3:
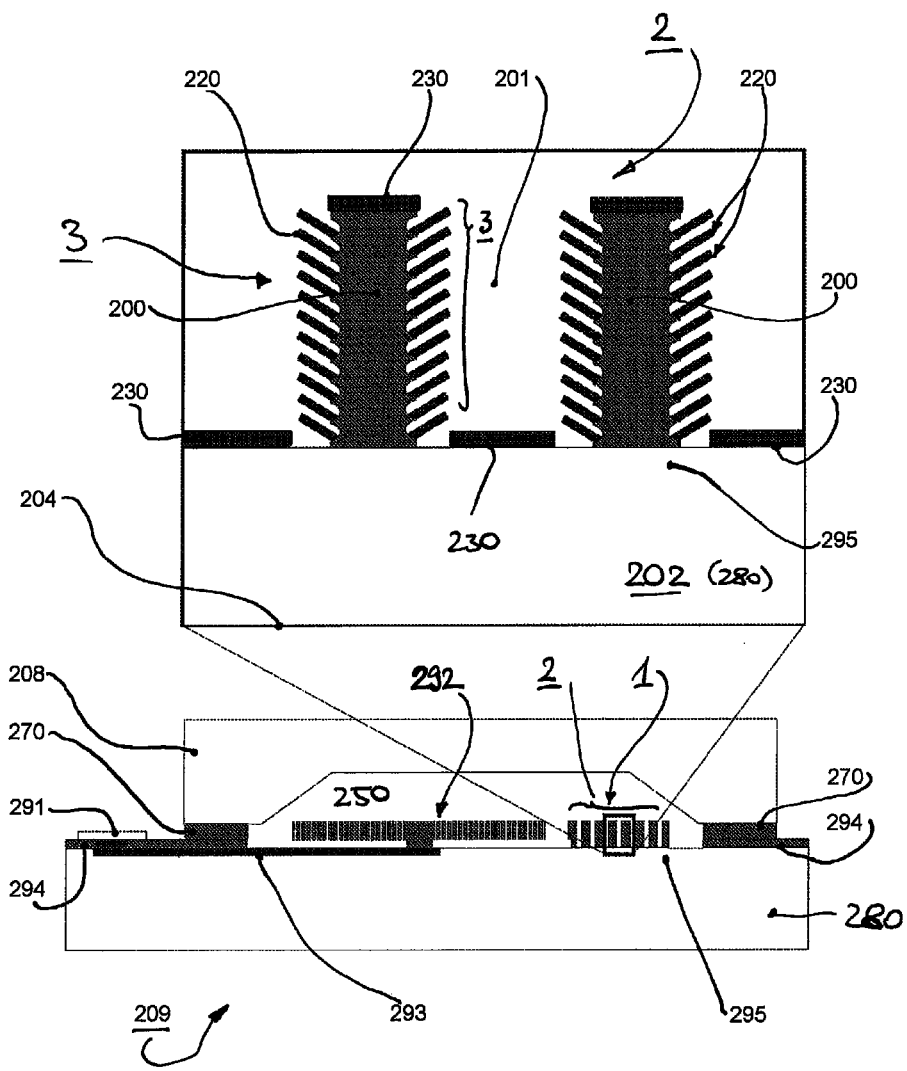
FIG. 3 is a schematic section of another configuration of a micro-electromechanical component having micro-surface structures according to FIG. 1.
Figure 4:
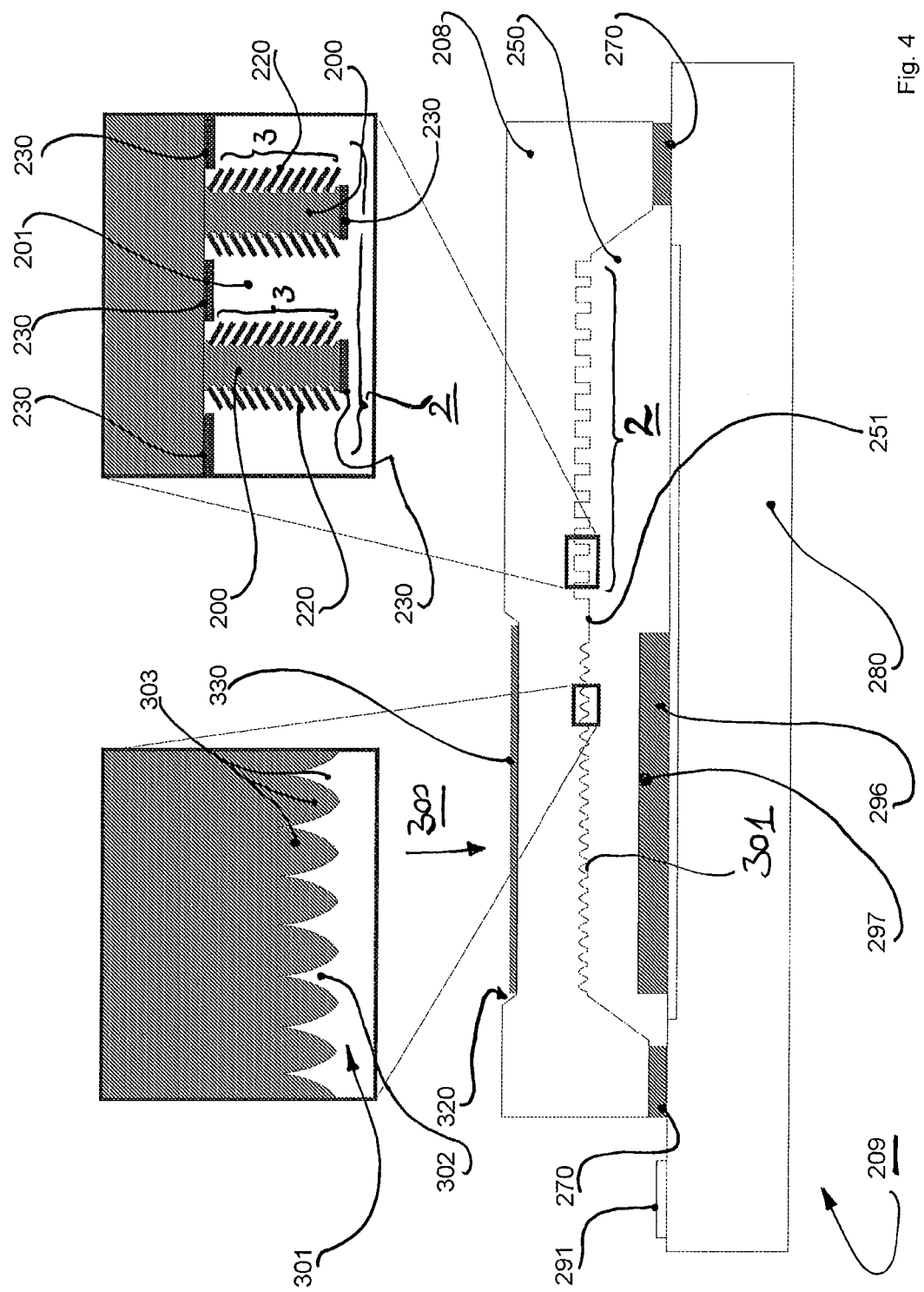
FIG. 4 is a schematic section of a third configuration of a micro-electromechanical component having micro-surface structures according to FIG. 1 and an optical aperture for IR radiation.

As can be seen in particular from FIGS. 2, 3 and 4, in a micro component 209 a plurality of solid members 200 constructed in accordance with FIG. 1 are arranged beside each other on a substrate 202. Free spaces 201 are again formed between adjacent solid members 200. In the configuration illustrated in FIG. 2, the solid members 200 are formed on a substrate 202 which forms a cover 208 for the illustrated micro component 209. In the substrate 202 which forms the cover 208 there is formed, for example by means of a suitable etching method, a recess which forms a cavity 250 together with a base substrate 280. The solid members 200 described above are arranged on the base 251 of the cavity 250 and are coated with functional material or getter 220, 230 in the manner described above.

The cover 208 is arranged on the base substrate 280 with a sealing frame 270 being located therebetween so that the cavity 250 is hermetically sealed with respect to the environment. On the side of the base substrate 280 facing the cover 208, one or more microstructures 290 is/are arranged. These may be, for example, vibration elements of inertial and rotational speed sensors. The measurement values detected with the microstructures 290 are converted in known manner into measurement signals which can be tapped by means of electrical connection contacting 290 which is illustrated by way of example.

FIG. 3 illustrates a further embodiment of a micro-electromechanical component 209 with the micro-surface according to the invention. The component 209 has a cover 208 with a corresponding cavity 250. The cover is connected to a base substrate 280 located therebelow by means of a sealing frame 270. The base substrate is coated on the surface thereof facing the cover 208 with a dielectric 295. An electrical conductor path 293 was in turn arranged on the dielectric 295, for example in the form of an electrode metal coating which was subsequently partially etched away. Above the electrical conductor path 293 and the dielectric 295 there is arranged a further dielectric 294 which is connected on the face thereof facing the base substrate 280 to the sealing frame 270. The connection between the cover 208, sealing frame 270, dielectrics 294, 295 and of the electrical conductor path 293 to the base substrate 280 is again hermetically sealed. Between the base substrate 280 and the cover 208, there is formed the cavity 250 in which a microstructure 292, for example a rotating oscillator with corresponding movement detection elements, is arranged on the base substrate 280. Furthermore, there is arranged in the cavity 250 a getter in the form of a micro-surface structure 1 according to the invention which, as already explained in connection with FIGS. 1 and 2, consists of the first fine structure 2 in the form of the solid members 200 and the getter material 220, 230 which is applied to the first fine structure 2 in the form of the second fine structure 3. The micro-surface structure 201 is arranged on the base substrate 280 or the dielectric layer 295 which is applied thereto and which in this instance as a micro component forms the substrate 202.

Figure 5:
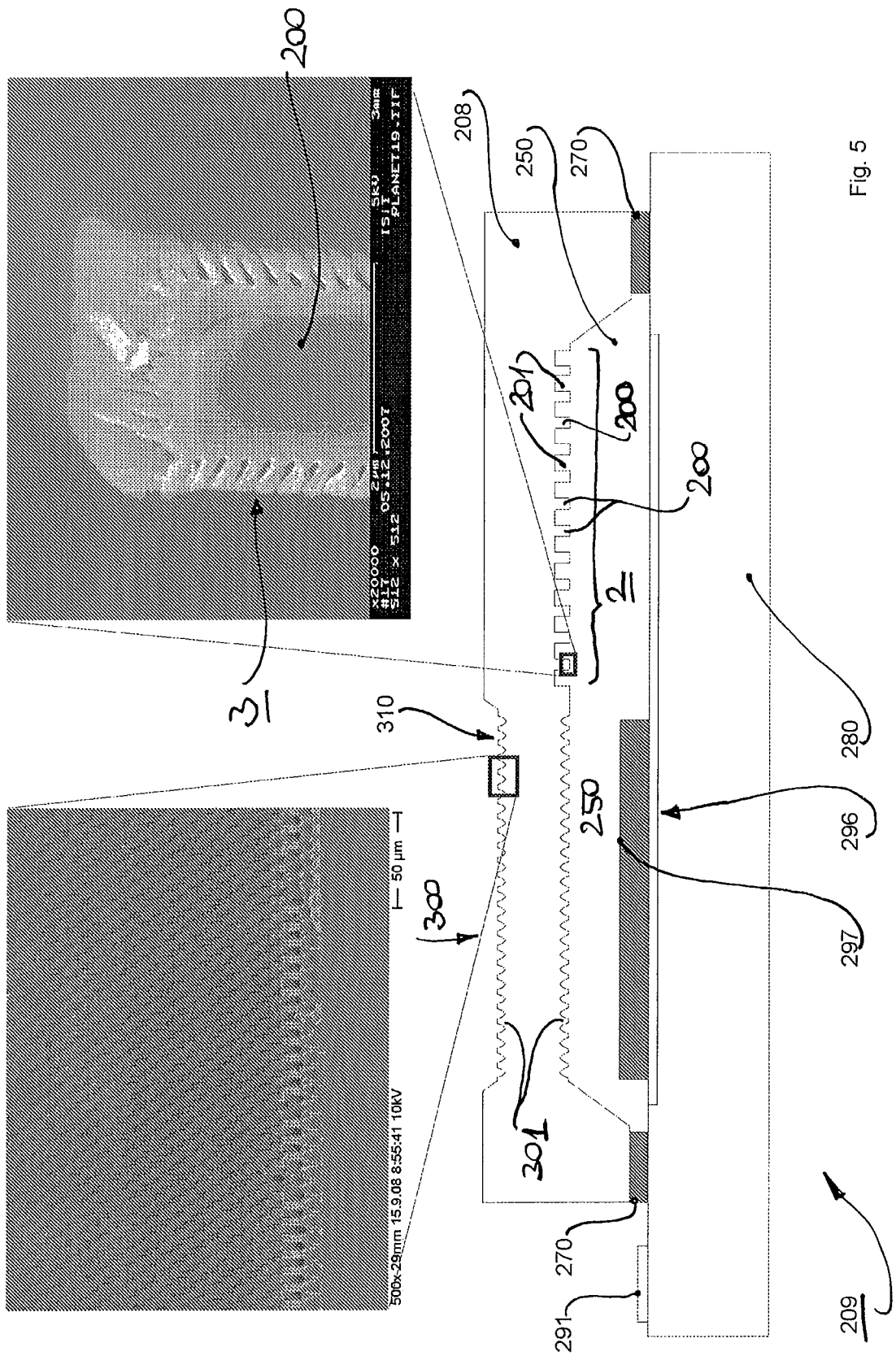
FIG. 5 is a schematic section of a fourth configuration of a micro-electromechanical component having micro-surface structures according to FIG. 1 and an optical aperture for IR radiation in another configuration.

Two further configurations of the invention are illustrated in FIGS. 4 and 5 in the form of a micro IR detector. The detector illustrated in FIG. 4 has a base substrate 280, into the upper side of which an integrated circuit 296 is introduced. The base substrate 280 further carries a sealing frame 270 which itself is connected to a cover 208. The base substrate 280, sealing frame 270 and cover 208 form a cavity 250 in which there is arranged on the base substrate 280 a micro structure 297 for detection of or interaction with optical or IR radiation. The cavity 250 is formed by a recess being etched in the substrate 202 which forms the cover 208. In the base 251 of the recess of the cover 208 there is formed as described above with reference to FIGS. 1-3 a first fine structure 2 of solid members 200 and intermediate spaces 201 and which is coated with a getter in the form of a second fine structure 3 as a thin layer 230 and in the form of blades 220. On the side of this, the cover 208 is constructed to form an optical aperture 300. At the side of the cover 208 facing the base substrate 280 there is provided a microstructured anti-reflective layer 301 which consists of solid members 303 which are spaced apart from each other by the spacing 302. The microstructured anti-reflective layer 301 is produced in the same manner as the first fine structure 2.

On the side of the cover 208 facing the microstructured anti-reflective layer 301 there is arranged a thin layer 330 for the anti-reflective coating of the optical aperture in an external recess 320 of the cover 208.

The micro component 209 illustrated in FIG. 5 differs from that of FIG. 4 in that, instead of the thin layer 330 in the recess 320, there is provided an external microstructured anti-reflective layer 310 which substantially corresponds to the microstructured anti-reflective layer 301 arranged in the cavity.

Figure 6:
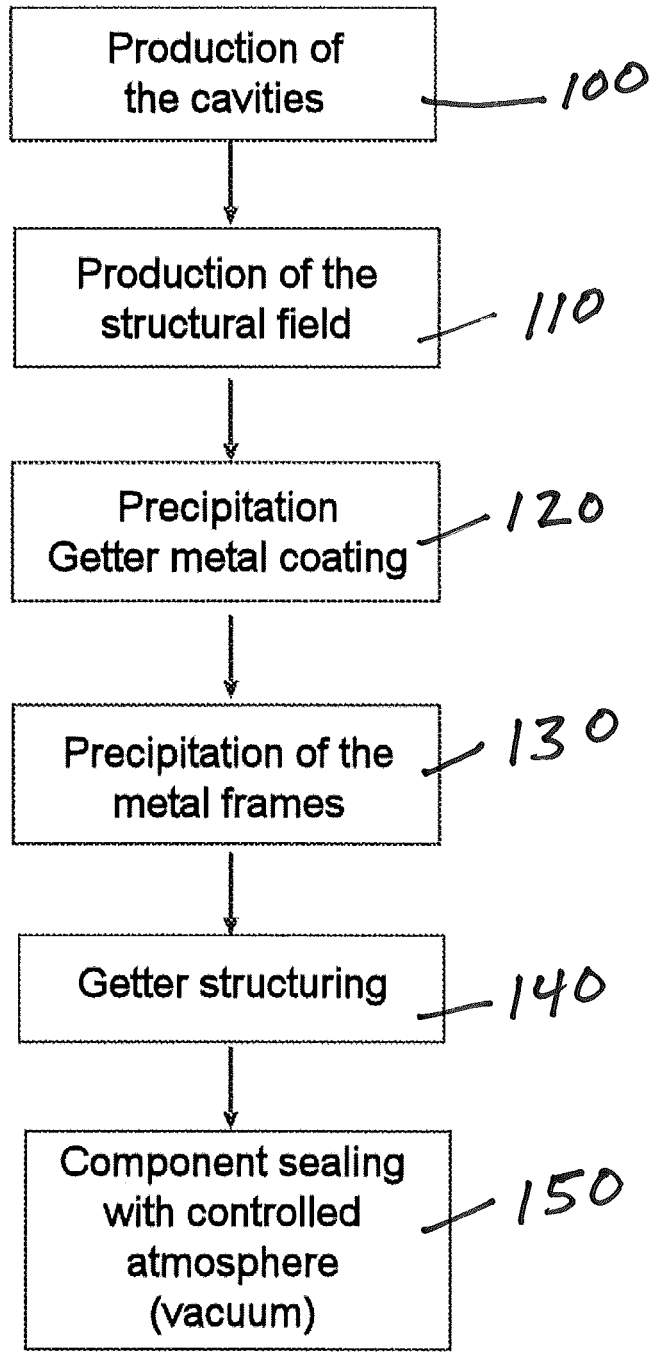
FIG. 6 is an illustration of a configuration of the method according to the invention, with reference to a flow diagram
Figure 7:
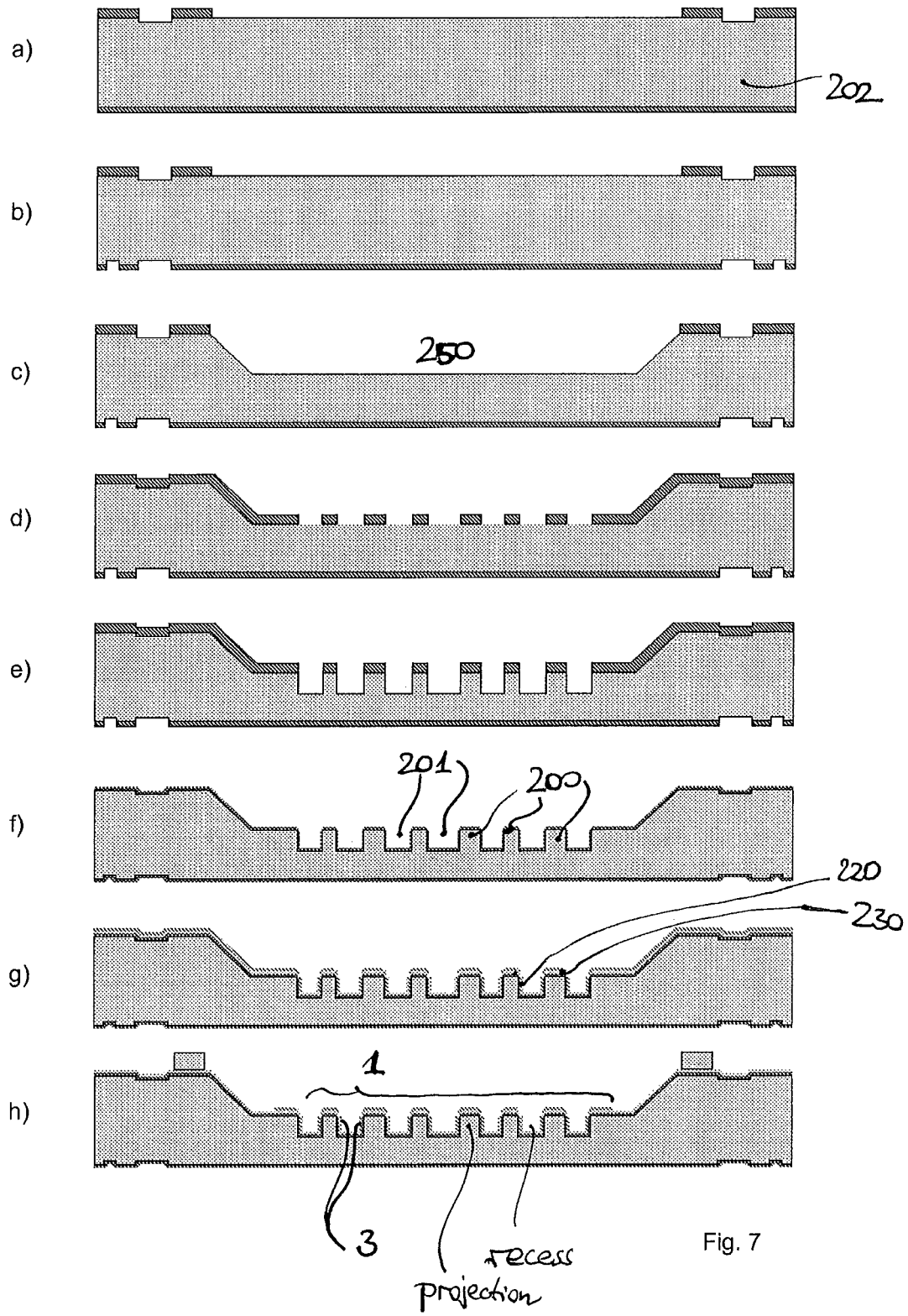
FIG. 7 is a cover substrate in various production steps.

An exemplary sequence of the method according to the invention is illustrated with reference to a flow chart in FIG. 6. The substrate 202 is illustrated in FIG. 7 in the corresponding production stages. In the method step 100, there are produced in the substrate 202 (FIG. 7c) recesses which form the subsequent cavity 250 of the micro component. The recesses are formed in the substrate by means of a conventional etching method.

The structural fields are produced in the method step 110. The structural fields in this instance are understood to refer to both the first fine structure 2 with solid members 200 and intermediate spaces 201 and the microstructured anti-reflective layers 301, 310. The structural fields are preferably produced by means of an anisotropic dry etching method with reactive gases, for example CF4, SF6 (FIG. 7c, d).

There is subsequently precipitated in the method step 120 a getter metal coating which is precipitated in particular on the first fine structure (200, 201) in the form of thin layers 230 and blades 220 (FIG. 7g).

In the method step 130 there is precipitated a metal frame which forms the subsequent sealing frame 270. The precipitation of the metal frame is preferably carried out by means of galvanic application, for example of gold or gold/tin (FIG. 7h).

The getter structuring is carried out in the following method step 140. In this instance, the lateral limits of the getter material applied are defined, for example by means of lift-off structuring (see FIGS. 7g, h). It is also possible to carry out a standard lithography operation with photo lacquer for covering the getter structure to be maintained and a subsequent structuring of the exposed getter material. This structuring can be carried out, depending on the getter material, in a wet chemical or dry manner, that is to say, with reactive gases (in the case of titanium and zirconium, for example, HF, etching containing HF).

In the method step 150 the component is finally sealed by bonding together the base substrate 280, sealing frame 270 and cover 208. The component sealing is carried out under a controlled atmosphere (vacuum).

The invention claimed is:

1. A method of forming a micro-surface structure on or in a substrate having a substrate plane and producing a micro-electromechanical component, the method comprising:
    forming a first fine structure into the substrate, said first fine structure comprising a plurality of first projections comprising surfaces for coating with a getter material, said surfaces extending substantially perpendicular relative to the substrate plane;
    said surfaces of the first fine structure at least partially comprising wave-like projections and recesses acting as wave-like arrangement, wherein the wave-like arrangement as surface for depositing the getter material is provided by dry etching;
    depositing the getter material in a slanted direction relative to the substrate plane, whereby the wave-like projections and recesses as the first fine structure provide both, a shadowing effect and nucleation points as growing zones for a plurality of solid members, built by the slanted deposition of the getter material;
    the nucleation points primarily being the projections of the wave-like arrangement, and the getter material upon slanted impinging growing in the form of a second fine structure with plural solid members protruding from the first projections; and
    applying the micro-surface structure to the micro-electromechanical component.

2. The method according to claim 1, wherein the first projections of the first fine structure are formed in a base of a cavity of the substrate.

3. The method according to claim 1, further comprising: applying a dielectric layer or an electrode metal to the substrate prior to applying the getter material.

4. The method according to claim 1, further comprising: applying a covering layer after the getter material has been applied.

5. The method according to claim 1, further comprising: applying a layer of lacquer to the getter material, wherein exposed regions of the getter material are subsequently structured.

6. The method according to claim 1, further comprising one of:
    removing a portion of the applied getter material to form an anti-reflective structure for infrared radiation; and
    limiting the applied getter material in a structuring process to partial regions within a cavity to form an anti-reflective structure for infrared radiation.

7. The method according to claim 4, wherein the covering layer comprises a gold or platinum covering layer applied by a vapour deposition process.

8. The method of claim 1, wherein the first fine structure is formed by anisotropic dry etching as well.

9. The method of claim 1, wherein the wave-like arranged projections and recesses comprise bump-like projections.

10. The method of claim 1, wherein a spacing of adjacent first projections is between 3 µm and 40 µm.

11. The method of claim 1, wherein a height of the first projections is below 50 µm.

12. The method of claim 1, wherein the first fine structure is formed by an anisotropic dry etching using a reactive gas or high speed etching, thereby freely selecting a geometry of the wave-like arrangement.

13. The method according to claim 1, wherein the plurality of solid members comprises blades or rods.

14. The method of claim 1, wherein the getter material is a moisture getter material having porous dielectric material.

15. A method of forming a micro-surface structure in or on a substrate having a substrate plane, and for producing a micro-electromechanical component, the method comprising the steps of:
    forming a first fine structure into the substrate, the substrate being one of polycrystalline silicon, silicon, germanium, and amorphous silicon, said first fine structure comprising a plurality of first recesses comprising surfaces extending not in parallel with the substrate plane;
    the surfaces of the first fine structure comprising wave-like arranged recesses and projections, acting as nucleation points where a getter material is primarily deposited in a slanted direction, wherein the slanted direction is between 60° to 80° relative to the substrate plane;
    the wave-like arranged projections and recesses providing a shadowing effect and nucleation points as growing zones for a plurality of solid getter members established by the getter material that is primarily deposited at the projections of the wave-like arrangement; and
    while depositing the getter material, the material grows in the form of a second fine structure with plural solid members protruding from the first recesses at an angle between 20° and 50° relative to the substrate plane.

16. The method according to claim 15, wherein the first recesses of the first fine structure are formed in a base of a cavity or recess of the substrate.

17. The method according to claim 15, further comprising:
    applying a dielectric layer or an electrode metal to the substrate prior to applying the getter material.

18. The method according to claim 15, further comprising:
    applying a covering layer after the getter material has been applied.

19. The method according to claim 18, wherein the covering layer comprises a gold or platinum covering layer applied by a vapour deposition process.

20. The method according to claim 15, further comprising:
    applying a layer of lacquer to the getter material, wherein exposed regions of the getter material are subsequently structured.

21. The method according to claim 15, further comprising one of:
    removing a portion of the applied getter material to form an anti-reflective structure for infrared radiation; and
    limiting the applied getter material in a structuring process to partial regions within a cavity to form an anti-reflective coating or structure for infrared radiation.

22. The method according to claim 15, further comprising applying the micro-surface structure in a micro-electromechanical component.

23. The method of claim 15, wherein adjacent first recesses are spaced apart from each other by a spacing of between 3 µm and 40 µm.

24. The method of claim 15, wherein a depth of the plurality of first recesses is less than 50 μm.

25. The method according to claim 15, wherein the plurality of solid members comprises blades or rods.

26. The method of claim 15, the wave-like arrangement as surface for depositing the getter material is provided by dry-etching.

27. The method of claim 15, the wave-like arranged projections and recesses comprise bump-like projections.

28. The method of claim 22, wherein a spacing of adjacent first recesses is between 3 μm and 4 μm.

29. The method of claim 23, wherein a depth of the first recesses is between 10 μm and 20 μm.

30. The method of claim 15, wherein the getter material is a moisture getter material having porous dielectric material.

* * * * *